(12) United States Patent
Shimo et al.

(10) Patent No.: US 6,766,811 B2
(45) Date of Patent: Jul. 27, 2004

(54) METHOD OF REMOVING SMEAR FROM VIA HOLES

(75) Inventors: Toshihisa Shimo, Kariya (JP); Kyoko Kumagai, Kariya (JP); Toshiki Inoue, Kariya (JP); Yoshifumi Kato, Kariya (JP); Takashi Yoshida, Kariya (JP); Masanobu Hidaka, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/213,619

(22) Filed: Aug. 7, 2002

(65) Prior Publication Data
US 2003/0036269 A1 Feb. 20, 2003

(30) Foreign Application Priority Data
Aug. 8, 2001 (JP) ........................................ 2001-240635

(51) Int. Cl.$^7$ ........................................... H01L 21/302
(52) U.S. Cl. .............................. 134/1.3; 216/13; 216/17; 216/18; 216/57; 216/65; 438/704; 438/725; 438/708
(58) Field of Search ........................... 216/13, 17, 18, 216/57, 65; 438/725, 704, 708, 714, 696, 723, 734, 743, 744, 750, 687; 134/1.3

(56) References Cited

U.S. PATENT DOCUMENTS

| 5,578,341 | A | | 11/1996 | Hirosawa ..................... 427/97 |
|---|---|---|---|---|
| 5,788,830 | A | * | 8/1998 | Sakamoto et al. .......... 205/183 |
| 6,242,079 | B1 | | 6/2001 | Mikado et al. ............. 428/209 |
| 6,242,344 | B1 | * | 6/2001 | Koh et al. ................... 438/638 |
| 6,391,472 | B1 | * | 5/2002 | Lamb, III et al. .......... 428/624 |
| 6,579,810 | B2 | * | 6/2003 | Chang ......................... 438/745 |
| 6,591,495 | B2 | * | 7/2003 | Hirose et al. ................. 29/846 |
| 2001/0042637 | A1 | * | 11/2001 | Hirose et al. ................ 174/255 |
| 2002/0076935 | A1 | * | 6/2002 | Maex et al. ................. 438/706 |
| 2004/0025333 | A1 | * | 2/2004 | Hirose et al. ................. 29/830 |

FOREIGN PATENT DOCUMENTS

| JP | 9-283923 | 10/1997 |
|---|---|---|
| JP | 2000-77851 | 3/2000 |
| TW | 380166 | 1/2000 |
| TW | 419786 | 1/2001 |
| TW | 407453 | 10/2001 |

* cited by examiner

*Primary Examiner*—George A. Goudreau
(74) *Attorney, Agent, or Firm*—Morgan & Finnegan, LLP

(57) ABSTRACT

An aqueous solution containing sulfuric acid and hydrogen peroxide is used for a soft etchant in a soft etching step in a smear removing process performed prior to a catalyst applying process for chemical copper plating after formation of via holes through an insulating layer of a multi-layer substrate by irradiation of laser. The concentration of sulfuric acid is 2.4 times or less than the concentration of hydrogen peroxide. Preferably, the concentration of sulfuric acid is in a range of 9 to 90 g/l, and the concentration of sulfuric acid is lower than the concentration of hydrogen peroxide. More preferably, the concentration of sulfuric acid is in a range of 9 to 18 g/l, and the concentration of hydrogen peroxide is in a range of 33 to 38.5 g/l. As a result, smear can be certainly removed without excessively etching a conductive layer in the smear removing process.

9 Claims, 2 Drawing Sheets

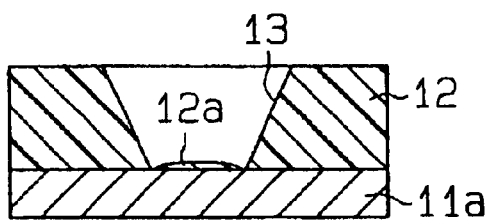
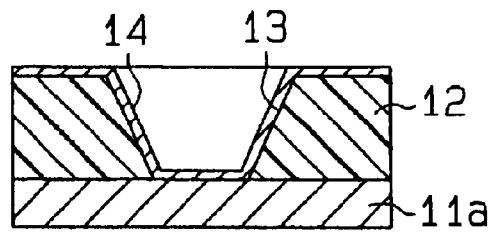
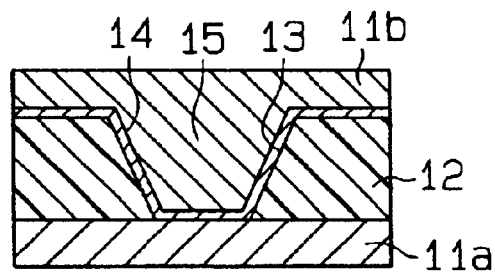
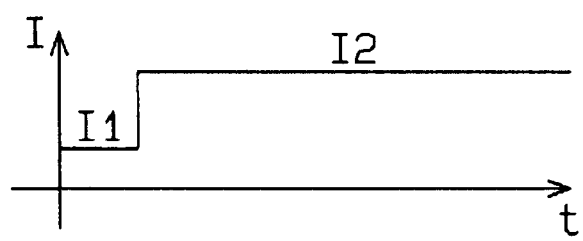
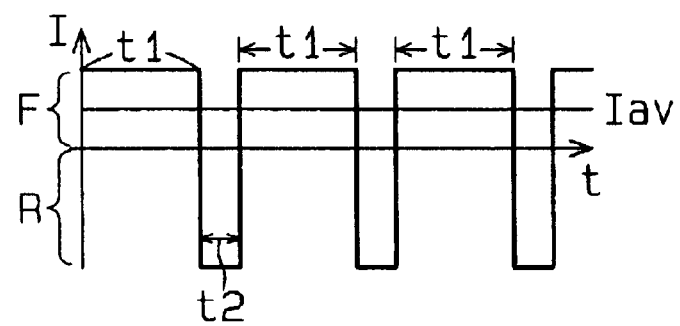

METHOD OF REMOVING SMEAR FROM VIA HOLES

BACKGROUND OF THE INVENTION

The present invention relates to a smear removing method suitable for removing smear from via holes, which is performed before plating copper in the via holes for interconnecting wiring layers in a multi-layer substrate of a semiconductor.

To increase the density of a multi-layer wiring board of a semiconductor, build-up wiring boards are used. The build-up wiring board employs via holes for interconnecting wiring layers. If the via holes are used only for interconnecting two layers, the inner wall of the via holes need not be plated. However, when three or more layers must be interconnected, via holes 31 not filled with plated metal must be displaced as shown in FIG. 4(a). On the other hand, via holes 31 filled with plated metal can be stacked as shown in FIG. 4(b), allowing a higher degree of freedom in the layout of wires, and a higher mounting density.

Conventional via holes have diameters of approximately 100 μm, so that via holes not plated inside do not impede the conductance between each of the layers. However, as via holes have smaller diameters, via holes not plated inside cause an increase in resistance to impede the conductance between each of the layers.

Via holes are formed by photo-etching using a photoresist or by irradiating a laser using a resin other than a photoresist as an insulating layer.

After via holes are formed, a smear removing process, a catalyst applying process, a chemical copper plating process, and an electrolytic copper plating process are performed before the plating is completed. As shown in FIG. 5(a), the smear removing process removes a resin remaining on the bottom of a via hole 34 (hereinafter called the "smear") when the via hole 34 is formed through an insulating layer 33 which overlies a lower wiring layer 32 formed on a substrate (not shown).

Then, conventionally, the smear removing process includes the five steps of swelling, permanganic acid etching, neutralization/reduction, cleaner conditioning, and soft etching, which are performed sequentially.

When the via hole 31 has a diameter of 100 μm, the insulating layer 33 is formed with the via hole 34 by a photolithography method, which uses a photoresist. If the via hole 31 has a diameter of smaller than approximately 40 μm, the photolithography method encounters difficulties in forming the clear via hole 34. For this reason, the via hole 34 is formed by irradiation of laser. However, when the via holes 34 formed by the irradiation of laser undergo the smear removing process under similar conditions to those when the via holes 34 are formed by the photolithography method, most of the via holes 34 do not satisfy a thermal shock test, which is one item of a via hole reliability test conducted after filling the via holes 31 with plated metal. The thermal shock test involves 1000 repetitions of immersion in a liquid at −55□C and in a liquid at 125° C. each for three minutes, and a resistance changing percentage within ±10% is determined as passed.

A soft etchant used in the soft etching step, which is the last processing in the conventional smear removing process, serves to slightly roughen the surface of a copper foil which comprises the lower wiring layer 32 for closing lower ends of via holes, as well as serves to remove smear.

Conventionally, used as the soft etchant is a sulfuric acid solution (sulfuric acid concentration: 98 g/l), a sulfuric acid and sodium persulfate solution (sulfuric acid concentration: 9.8 g/l, sodium persulfate concentration: 150 g/l), or a sulfuric acid and hydrogen peroxide solution (sulfuric acid concentration 98 g/l, hydrogen peroxide concentration: 27 g/l).

Conventionally, since the via hole 34 is formed by the photolithography method, only a small amount of smear is produced, so that the soft etchant relatively satisfactorily removes smear and roughens the copper foil. However, the use of laser irradiation for forming the via hole 34 causes an increased amount of smear. Therefore, when the same soft etchant is used for the soft etching under the same conditions as in the conventional process, the smear is not completely removed, with the result that the via hole is not satisfactorily filled with plated metal. Also, when the dissolving power of the soft etchant is excessively increased, the lower wiring layer 32 is excessively etched to produce a gap A between the copper foil and resin, as shown in FIG. 5(b). If the via hole is plated in the shown state, a portion corresponding to the gap is more likely to crack in the thermal shock test, which is conducted after the via hole is filled with plated metal.

SUMMARY OF THE INVENTION

It is an objective of the present invention to provide a method of removing smear from via holes, which is capable of removing the smear without fail in a smear removing process without excessively etching a conductive layer when the via holes have small diameters, for example, even when via holes having a diameter of 40 μm are formed by the irradiation of laser.

To achieve the foregoing and other objectives and in accordance with the purpose of the present invention, a method of removing smear from via holes is provided. The method includes: providing a multi-layer substrate that has a conductive layer and an insulating layer provided on the conductive layer; forming a via hole in the insulating layer provided on the conductive layer; removing smear remaining on a part of the conductive layer that is the bottom of the via hole by soft etching with a soft etchant, wherein the soft etchant is an aqueous solution containing a sulfuric acid and hydrogen peroxide, and wherein the concentration of the sulfuric acid is 2.4 times the concentration of hydrogen peroxide or less; forming a chemical copper plating layer on the entire inner surface of the via hole including the bottom by performing chemical copper plating; and forming fill-plating layer in the via hole by performing electrolytic copper plating.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 1(a) to 1(c) are schematic cross-sectional views showing a procedure of forming a fill-plating layer of a via hole according to one embodiment of the present invention;

FIG. 2(a) is a time chart showing plating conditions in the procedure of FIGS. 1(a) to 1(c);

FIG. 2(b) is a schematic time chart showing pulse plating conditions in the procedure of FIGS. 1(a) to 1(c);

DETAILED DESCRIPTION OF THE PREFERRED EMBODIMENTS

Figure 3:
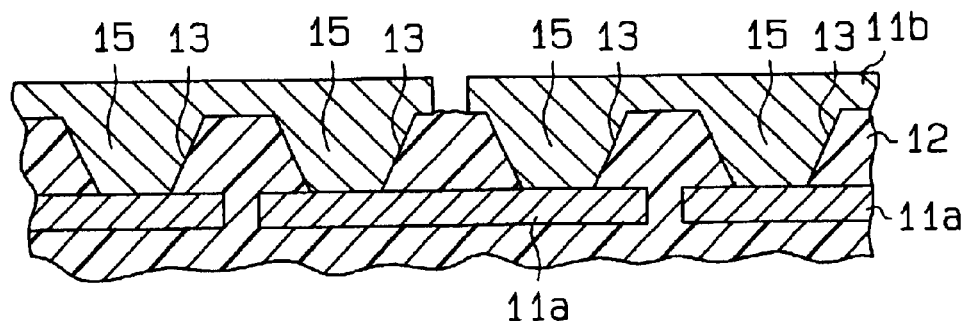
FIG. 3 is a schematic cross-sectional view of a substrate for reliability evaluation in the procedure of FIGS. 1(a) to 1(c)
Figure 4A:
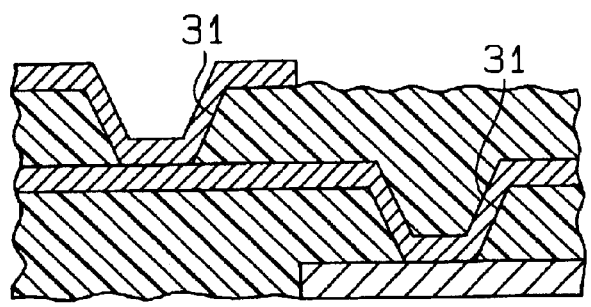
FIG. 4(a) is a schematic cross-sectional view when via holes are not fill-plated.
Figure 4B:
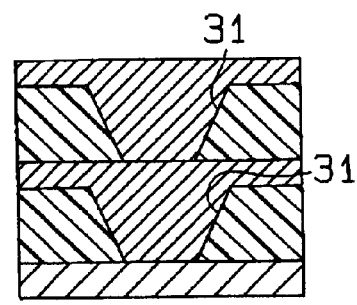
FIG. 4(b) is a schematic cross-sectional view when via holes are fill-plated.
Figure 5A:
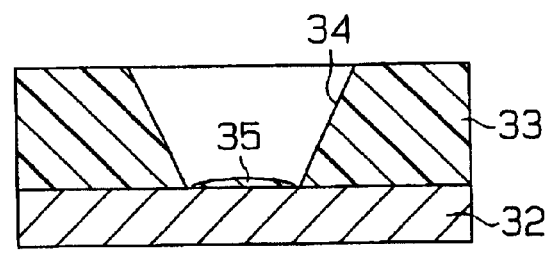
FIGS. 5(a) and 5(b) are schematic cross-sectional views showing via holes from which smear is removed by a conventional smear removing process.
Figure 5B:
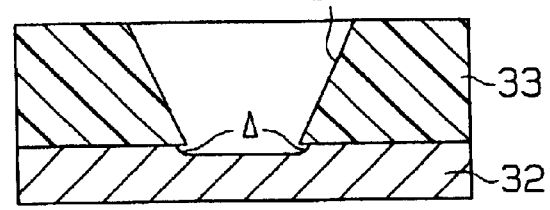

An embodiment of a method of removing smear from via holes according to the present invention will be described below with reference to FIGS. 1(a) to 3. In this embodiment, via holes having a diameter of 40 µm are formed.

For forming fill-plated via holes for electrically interconnecting conductive layers formed on upper and lower sides of a multi-layer substrate, an insulating layer 12 is first formed on an underlying conductive layer 11a, and then a via hole 13 is formed by irradiation of laser, as shown in FIG. 1(a).

Next, smear 12a remaining on the conductive layer 11a, which is the bottom of the via hole 13, is removed in a smear removing process. The smear removing process includes the five steps of swelling, permanganic acid etching, neutralization/reduction, cleaner conditioning, and soft etching, which are performed sequentially, as in the conventional process. The smear removing process is performed under the same conditions as in the conventional process except that a soft etchant used in the soft etching step has a different composition.

An aqueous solution containing sulfuric acid, which is an inorganic acid, and hydrogen peroxide is used as the soft etchant. The concentration of sulfuric acid in the aqueous solution is 2.4 times or less higher than that of hydrogen peroxide. The concentration of sulfuric acid is in a range of 9 to 90 g/l, and the concentration of sulfuric acid is preferably lower than that of hydrogen peroxide. More preferably, the concentration of sulfuric acid is in a range of 9 to 18 g/l, and the concentration of hydrogen peroxide is in a range of 33 to 38.5 g/l.

After the smear removing process is completed, the catalyst applying step and chemical copper plating step are performed on the inner wall of the via hole 13 and an upper layer on which a conductive layer 11b is to be formed to form a thin chemical copper plating layer 14, as shown in FIG. 1(b). Next, the electrolytic copper plating step is performed to form a fill-plating layer 15, as shown in FIG. 1(c).

The electrolytic copper plating step is performed in two stages. As shown in FIG. 2(a), in the first stage, electrolytic copper plating is performed for a predetermined time period at a low current density, and in the second stage, plating is performed at a high current density. The first stage plating forms a dense electrolytic copper plating layer in a predetermined thickness on the chemical copper plating layer 14. Then, the second stage plating forms an electrolytic copper plating layer to fill a remaining portion of the via hole 13 to form the fill-plating layer 15.

The electrolytic plating is performed with the current density within an allowable current range of a plating bath. The first stage plating is performed with the current density equal to or less than 1.5 A/dm$^2$ to deposit copper in a thickness of 1 µm or more, preferably in a range of 1.5 to 2.0 µm. Then, the second stage plating is performed at a current density higher than that in the first stage plating. Though depending on the composition of the plating bath of the electrolytic copper plating, the current density in the second stage plating is preferably on the order of 3 A/dm$^2$ to complete the electrolytic copper plating for approximately 30 minutes in total.

As shown in FIG. 2(b), the electrolytic copper plating is performed with pulse plating, which includes alternating positive pulses and negative pulses, with a larger conduction amount set for the positive pulses. The ratio t1/t2, a conduction time t1 of the positive pulses to a conduction time t2 of the negative pulses, of the pulse plating is set, for example, to 20/1. The conduction time t1 is each set to approximately 40 to 50 ms. the ratio F/R, a current value F of the positive pulses to a current value R of the negative pulses, of the pulse plating is set to approximately ⅓. In FIG. 2(b), the ratio t1/t2, the conduction time t1 to the conduction time t2, is different from the foregoing value.

The present invention will be described below in greater detail in connection with examples and comparative examples.

As shown in FIG. 3, after forming an evaluation substrate formed with a large number of via holes 13, and removing smear in different soft etching conditions in the smear removing process, the via holes 13 were plated. Then, the resulting samples underwent a reliability evaluation, which consisted of four items shown in Table 1, i.e., a high temperature standing test, a high temperature/high humidity standing test, a thermal shock test, and a soldering heat test.

In the examples and the comparative examples, other steps in the smear removing process except for the soft etching step, i.e., the catalyst applying step and chemical copper plating step were performed under known processing conditions. Used as additives to a plating bath in the electrolytic copper plating were Impulse H (trade name) brightener and leveler manufactured by Atotech. Respective doses were chosen to be 2.5 ml/l of brightener, and 8 ml/l of leveler, as recommended by the manufacturer. Then, pulse plating was performed at a low current density, for example, 1 A/dm$^2$ for 10 minutes, and at a high current density, for example, 3 A/dm$^2$ for 20 minutes.

TABLE 1

| Item | Condition | Evaluation criteria |
| --- | --- | --- |
| High temperature standing test | 150° C. × 1000 hours | Resistivity changing percentage within ±10% |
| High temperature/high humidity standing test | 85° C., 85% RH × 1000 hours | |
| Thermal shock test | −55° C., 125° C. (three minutes each) × 1000 cycles | |
| Solder heat test | 280–290° C. × 30 seconds | |

In the soldering heat test, samples were immersed in a soldering bath at 280 to 290° C. for a predetermined time period, for example, 30 seconds, and cooled down, and the resistances were measured.

Within the four items of the evaluation test, the comparative examples also passed the high temperature standing test and the high temperature/high humidity standing test. However, the comparative examples presented a low successful rate in the soldering heat test and thermal shock test.

Table 2 shows soft etching conditions and the result of the reliability test, and the via holes 13 after the soft etching which were observed using a microscope for examples and comparative examples.

TABLE 2

| | Soft etching conditions | | | Reliability | Processing result |
|---|---|---|---|---|---|
| Example 1 | Sulfuric acid | 50 ml/l | 25° C. | O* | III * |
| | Hydrogen peroxide solution | 100 ml/l | 1–3 minutes | | |
| Example 2 | Sulfuric acid | 25 ml/l | 25° C. | O | III * |
| | Hydrogen peroxide solution | 100 ml/l | 1–3 minutes | | |
| Example 3 | Sulfuric acid | 5 ml/l | 25° C. | O | III * |
| | Hydrogen peroxide solution | 95 ml/l | 1–3 minutes | | |
| Comparative example 1 | Sulfuric acid | 100 ml/l | 25° C. 1–3 minutes | X* | II * |
| Comparative example 2 | Hydrogen peroxide | 100 ml/l | 25° C. 1–3 minutes | X | II * |
| Comparative example 3 | Sulfuric acid | 100 ml/l | 25° C. | X | I * |
| | Hydrogen peroxide solution | 80 ml/l | 1–3 minutes | | |
| Comparative example 4 | Sulfuric acid | 10 ml/l | 25° C. | X | II * |
| | Sodium persulfate solution | 150 g/l | 1–3 minutes | | |

* O . . . sufficient
X . . . insufficient
I . . . Excessive etching (the copper foil below the resin layer was etched)
II . . . Insufficient etching (smear remains on the copper foil)
III . . . Good (no smear remains on the copper foil without excessive etching)

In Table 2, sulfuric acid refers to concentrated sulfuric acid (concentration: 98%), and hydrogen peroxide solution refers to industrial hydrogen peroxide solution (concentration: 33% to 35%). Therefore, 5 m/l of sulfuric acid corresponds to 9.0 g/l of sulfuric acid, and 100 ml/l of sulfuric acid corresponds to 180.3 g/l of sulfuric acid. Likewise, 5 ml/l of hydrogen peroxide solution corresponds to 1.9 g/l of hydrogen peroxide, and 100 ml/l of hydrogen peroxide solution corresponds to 37.7 g/l of hydrogen peroxide.

It was confirmed from Table 2 that smear is satisfactorily removed without excessively etching the copper foil (conductive layer 11a) and the reliability of the fill-plating layer is passed when using the soft etchants of examples 1 to 3, i.e., a sulfuric acid and hydrogen peroxide solution in which the concentration of sulfuric acid is 2.4 times or less than the concentration of the hydrogen peroxide. It was also confirmed that the concentration of sulfur acid in a range of 9 to 90 g/l, and the concentration of sulfuric acid lower than the concentration of hydrogen peroxide result in better performance; and the concentration of sulfuric acid in a range of 9 to 18 g/l and the concentration of hydrogen peroxide in a range of 33 to 38.5 g/l result in even better performance.

On the other hand, when conventional soft etchants of the comparative examples were used, the fill-plating layers failed the reliability test in any of the cases. In addition, smear remained in the soft etching step (Comparative examples 1, 2), or the conductive layer 11a comprising the copper foil below the insulating layer 12 made of a resin was etched by excessive etching, though smear was removed (comparative examples 3, 4).

The foregoing embodiment provides the following advantages.

(1) In the method of forming via holes filled with plated metal by electrolytic copper plating, an aqueous solution containing sulfuric acid and hydrogen peroxide is used as a soft etchant in the smear removing process, where the concentration of the sulfuric acid is chosen to be 2.4 times or less than the concentration of the hydrogen peroxide. Therefore, even when via holes have small diameters (for example, 40 μm) formed by irradiation of laser, smear 12a is certainly removed without excessively etching a lower wiring layer comprising the conductive layer 11a.

(2) When the concentration of sulfuric acid is set in a range of 9 to 90 g/l in the soft etchant, and the concentration of the sulfuric acid is set lower than the concentration of the hydrogen peroxide solution, smear is removed more satisfactorily.

(3) Smear is removed more satisfactorily by setting the concentration of sulfuric acid in a range of 9 to 18 g/l, and the concentration of hydrogen peroxide in a range of 33 to 38.5 g/l in the soft etchant.

(4) Since the soft etching step can be performed under the same conditions as in the conventional process in terms of temperature and time, the present invention can be readily practiced only by replacing the soft etchant.

(5) Since industrial hydrogen peroxide solution is used for the hydrogen peroxide solution of the soft etchant, the soft etchant can be readily prepared as compared with using sterilizing hydrogen peroxide which has a low concentration.

(6) The electrolytic copper plating is performed in the first stage plating with a low current density and the second plating with a high current density. Thus, deposition of dendrite crystals is prevented and copper is electrolytically plated densely and uniformly on the surface of the chemical copper plating layer 14. Also, voids, which affect the reliability, do not occur in the via holes, so that the via holes is plated in a short time.

(7) Both of the first stage plating with a low current density and the second stage plating with a high current density are performed using pulse plating which includes alternating positive pulses and negative pulses with a larger conduction amount set for the positive pulses. It is therefore possible to form the fill-plating layer with ensured reliability in a short time.

The present invention is not limited to the foregoing, but may be modified, for example, in the following manner.

When the soft etchant is prepared, low concentration sulfuric acid and hydrogen peroxide solution may be used to provide a desired concentration, not limited to the use of concentrated sulfuric acid of 98% and industrial hydrogen peroxide solution of 30% to 35%.

The soft etching may be performed at higher temperatures, not limited at a room temperature (25° C.). A suitable time for the soft etching varies depending on the temperature.

The soft etchant may be used for removing smear when via holes are formed by the photolithography method.

Instead of the electrolytic copper plating in two stages, the fill-plating layer 15 may be formed by performing pulse plating with an electric density equal to or lower than 1.5 A/dm$^2$ in an allowable current range of the plating bath for a long time, i.e., by single-stage electrolytic copper plating.

The electrolytic copper plating for depositing a thickness of 1 μm or more with a current density equal to or lower than 1.5 A/dm$^2$ in an allowable current range of the plating bath may be performed by supplying DC power, rather than pulse plating, and the subsequent electrolytic copper plating with a high current density may be performed using the pulse plating.

The diameter of the via holes 13 is not limited to 40 μm, but the present invention may be applied to via holes having diameters larger than 40 μm or to via holes having diameters of approximately 20 μm which are smaller than 40 μm.

In the above embodiments, an aqueous solution containing sulfuric acid and hydrogen peroxide is used as the soft etchant. However, a soft etchant that contains an inorganic acid other than sulfuric acid may be used. For example, a soft etchant containing hydrochloric acid or nitric acid may be used Therefore, the present examples and embodiments are to be considered as illustrative and not restrictive and the invention is not to be limited to the details given herein, but may be modified within the scope and equivalence of the appended claims.

What is claimed is:

1. A method comprising:
    providing a multi-layer substrate that has a conductive layer and an insulating layer provided on the conductive layer;
    forming a via hole in the insulating layer provided on the conductive layer;
    removing smear remaining on a part of the conductive layer that is the bottom of the via hole by soft etching with a soft etchant, wherein the soft etchant is an aqueous solution containing a sulfuric acid and hydrogen peroxide, and wherein the concentration of the sulfuric acid is 2.4 times the concentration of hydrogen peroxide or less;
    forming a chemical copper plating layer on the entire inner surface of the via hole including the bottom by performing chemical copper plating; and
    forming fill-plating layer in the via hole by performing electrolytic copper plating.

2. The method according to claim 1, wherein the concentration of the sulfuric acid is in a range of 9 to 90 g/l, and is lower than the concentration of the hydrogen peroxide.

3. The method according to claim 1, wherein the concentration of the sulfuric acid is in a range of 9 to 18 g/l, and wherein the concentration of the concentration of the hydrogen peroxide is in a range of 33 to 38.5 g/l.

4. The method according to claim 1, wherein the concentration of the hydrogen peroxide is equal to or higher than 33 g/l.

5. The method according to claim 1, wherein industrial hydrogen peroxide solution is used as the hydrogen peroxide.

6. The method according to claim 1, wherein the soft etching is performed at a room temperature for one through three minutes.

7. The method according to claim 1, wherein the via hole is formed by irradiating laser on the insulating layer.

8. A method comprising:
    forming a via hole in an insulating layer provided on a conductive layer by irradiating laser on the insulating layer;
    removing smear remaining on a part of the conductive layer that is the bottom of the via hole by soft etching with a soft etchant, wherein the soft etchant is an aqueous solution containing a sulfuric acid and hydrogen peroxide, and wherein the concentration of the sulfuric acid is 2.4 times the concentration of hydrogen peroxide or less;
    forming a chemical copper plating layer on the entire inner surface of the via hole including the bottom by performing chemical copper plating; and
    forming fill-plating layer in the via hole by performing electrolytic copper plating.

9. The method according to claim 8, wherein the concentration of the sulfuric acid is in a range of 9 to 18 g/l, and wherein the concentration of the concentration of the hydrogen peroxide is in a range of 33 to 38.5 g/l.

* * * * *

UNITED STATES PATENT AND TRADEMARK OFFICE
CERTIFICATE OF CORRECTION

PATENT NO. : 6,766,811 B2 Page 1 of 1
DATED : July 27, 2004
INVENTOR(S) : Toshihisa Shimo et al.

It is certified that error appears in the above-identified patent and that said Letters Patent is hereby corrected as shown below:

Column 2,
Line 19, please delete "A" and insert therefore -- $\Delta$ --

Signed and Sealed this

Thirtieth Day of November, 2004

JON W. DUDAS
*Director of the United States Patent and Trademark Office*